(12) United States Patent
Shim et al.

(10) Patent No.: US 11,862,500 B2
(45) Date of Patent: Jan. 2, 2024

(54) APPARATUS FOR MANUFACTURING DISPLAY DEVICE AND METHOD FOR MANUFACTURING DISPLAY DEVICE

(71) Applicant: Samsung Display Co., Ltd., Yongin-si (KR)

(72) Inventors: Jae Won Shim, Yongin-si (KR); Yoon Jae Lee, Yongin-si (KR); Sung Lae Kim, Hwaseong-si (KR); Kang Won Lee, Gumi-si (KR); Kyung Hoon Chung, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 450 days.

(21) Appl. No.: 17/154,861

(22) Filed: Jan. 21, 2021

(65) Prior Publication Data

US 2021/0343566 A1    Nov. 4, 2021

(30) Foreign Application Priority Data

Apr. 29, 2020  (KR) .................... 10-2020-0051949

(51) Int. Cl.
| | | |
|---|---|---|
| *H01L 21/683* | (2006.01) | |
| *H01L 21/687* | (2006.01) | |
| *C23C 14/24* | (2006.01) | |
| *C23C 14/50* | (2006.01) | |
| *H10K 71/16* | (2023.01) | |

(52) U.S. Cl.
CPC .......... *H01L 21/6833* (2013.01); *C23C 14/24* (2013.01); *C23C 14/50* (2013.01); *H01L 21/6875* (2013.01); *H01L 21/68771* (2013.01); *H10K 71/16* (2023.02)

(58) Field of Classification Search
CPC . H01L 21/6831–6833; H01L 21/6835–68792; C23C 14/50; C23C 16/4585
See application file for complete search history.

(56) References Cited

U.S. PATENT DOCUMENTS

| | | | |
|---|---|---|---|
| 2012/0291950 A1* | 11/2012 | Sugiyama | ........... H01L 21/6835 156/60 |
| 2019/0153588 A1* | 5/2019 | Boughton | ........... C23C 16/4586 |
| 2021/0343566 A1* | 11/2021 | Shim | .................. H01L 21/6833 |

FOREIGN PATENT DOCUMENTS

| | | |
|---|---|---|
| KR | 10-0550648 | 2/2006 |
| KR | 10-1383282 | 4/2014 |
| KR | 10-1401473 | 6/2014 |
| KR | 10-1735993 | 5/2017 |
| KR | 10-2017-0092727 | 8/2017 |
| KR | 10-2019-0056188 | 5/2019 |

* cited by examiner

*Primary Examiner* — Jarrett J Stark
(74) *Attorney, Agent, or Firm* — H.C. Park & Associates, PLC

(57) ABSTRACT

An apparatus for manufacturing a display device includes: a first housing having a first chamber; a support member disposed in the first chamber and including a frame having a plurality of openings; a plurality of adhesive patterns disposed on the frame; and a plurality of electrostatic supports overlapping the plurality of openings and supported for reciprocal movement in respective ones of the openings.

11 Claims, 14 Drawing Sheets

APPARATUS FOR MANUFACTURING DISPLAY DEVICE AND METHOD FOR MANUFACTURING DISPLAY DEVICE

CROSS REFERENCE TO RELATED APPLICATION

This application claims priority from and the benefit of Korean Patent Application No. 10-2020-0051949, filed on Apr. 29, 2020, which is hereby incorporated by reference for all purposes as if fully set forth herein.

BACKGROUND

Field

Embodiments of the invention relate generally to display devices, and more specifically, to apparatus for manufacturing a display device and a method for manufacturing the same.

Discussion of the Background

The importance of display devices has increased with the development of multimedia. Accordingly, various types of display devices, such as a liquid crystal display (LCD) device and an organic light emitting diode display (OLED) device have been used.

Recently, portable electronic devices have been widely used. For example, mobile electronic devices such as tablet PCs have been widely used in recent years in addition to small electronic devices such as mobile phones.

Methods of forming a thin film on a substrate include physical vapor deposition (PVD) methods such as vacuum thermal evaporation or E-beam evaporation. In order to perform such a deposition method, a substrate needs to be fixed to a chuck plate so that the surface of the substrate on which the thin film is deposited faces downward.

The above information disclosed in this Background section is only for understanding of the background of the inventive concepts, and, therefore, it may contain information that does not constitute prior art

SUMMARY

Applicant realized that the reliability of display devices is hampered by conventional apparatus and methods for manufacturing display devices, which may damage the display device and/or allow foreign substances to become attached to the substrate of the display device.

Apparatus for manufacturing display devices constructed according to the principles and embodiments of the invention and methods for manufacturing the same can produce display devices with relatively high reliability and yield. The apparatus and the method may minimize the damage to substrate of the display device when attached to a chuck plate and reduce the ability of foreign substances to be attached to an upper surface of the substrate during manufacturing. For example, embodiments of the invention may prevent and/or reduce the damage to the display device and the substrate by fixing the substrate to a support plate of the apparatus using one or more electrostatic chucks that contact a lower surface of the substrate rather than an upper surface of the substrate on which elements of the display device are to be formed. In addition, this configuration may prevent foreign substances from being attached to the upper surface of the substrate.

Additional features of the inventive concepts will be set forth in the description which follows, and in part will be apparent from the description, or may be learned by practice of the inventive concepts.

According to one aspect of the invention, an apparatus for manufacturing a display device includes: a first housing having a first chamber; a support member disposed in the first chamber and including a frame having a plurality of openings; a plurality of adhesive patterns disposed on the frame; and a plurality of electrostatic supports overlapping the plurality of openings and supported for reciprocal movement in respective ones of the openings.

The plurality of adhesive patterns may include pressure-sensitive chucks spaced apart from each other, and upper surfaces of the pressure-sensitive chucks may be located in substantially the same plane.

The pressure-sensitive chucks may have substantially the same shape and size.

The plurality of electrostatic supports may include a first electrostatic support extending in a first direction and a second electrostatic support extending in a second direction intersecting the first direction.

The apparatus may further include one or more elevating devices to move the plurality of electrostatic supports through the openings. Upper surfaces of the plurality of electrostatic supports may be configured to move in the openings while maintaining substantially the same plane.

The electrostatic supports may include electrostatic chucks and the one or more elevating devices may be coupled to the plurality of electrostatic chucks.

The apparatus may further include: a control unit to operate the one or more elevating devices to move the plurality of electrostatic supports reciprocally through the openings such that a target substrate to be mounted on the plurality of electrostatic supports is pressed against upper surfaces of the adhesive patterns.

The apparatus may further include: a movable support supporting the support member. The movable support may include one or more elevating devices to move the support member in a direction substantially normal to a surface of the plurality of electrostatic supports.

The apparatus may further include: a second housing having a second chamber connected spatially with the first chamber; and a substrate processing device disposed in the second chamber.

The substrate processing device may include a deposition source having a material to be deposited and a nozzle to inject the material from the deposition source.

The support member may include a chuck plate, the chuck plate including a first area in which the material is deposited by the substrate processing device and a second area surrounding the first area, and the plurality of adhesive patterns may be disposed in the second area.

According to another aspect of the invention, a method for manufacturing a display device including the steps of: preparing a target substrate, a support plate including frame and an opening defined therein, a plurality of adhesive patterns disposed on the frame, and an electrostatic support overlapping the opening and positioned above the support plate; placing and fixing the target substrate on the electrostatic support; and moving the electrostatic support toward the opening such that the target substrate is attached to the frame of the support plate via the adhesive patterns.

The step of placing and fixing the target substrate on the electrostatic support may include applying voltage to the electrostatic support.

The step of placing and fixing the target substrate on the electrostatic support may further include generating a vacuum atmosphere in a first chamber of a first housing in which the target substrate and the electrostatic chuck are disposed.

The method may further include the steps of: preparing a deposition device in a second chamber of a second housing; moving the support plate attached to the target substrate to the second chamber; depositing a deposition material on the target substrate; moving the support plate to the first chamber; placing the support plate on the electrostatic support; and separating the target substrate from the electrostatic support by lifting the electrostatic support.

The electrostatic support may include an electrostatic chuck and the step of moving the electrostatic support may include stop applying voltage to the electrostatic chuck.

The step of moving the electrostatic support may include using an elevating device disposed below the electrostatic support to lower the electrostatic support.

The support plate may include a chuck plate, and the step of moving the electrostatic support may include attaching the target substrate to the adhesive patterns including pressure-sensitive chucks.

The method may further include the step of further lowering the electrostatic support so that an upper surface of the electrostatic support is located below a rear surface of the chuck plate after the target substrate is attached to the pressure-sensitive chucks.

The step of further lowering the electrostatic support may include further lowering the electrostatic support such that the target substrate is locally bent around the opening of the chuck plate.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
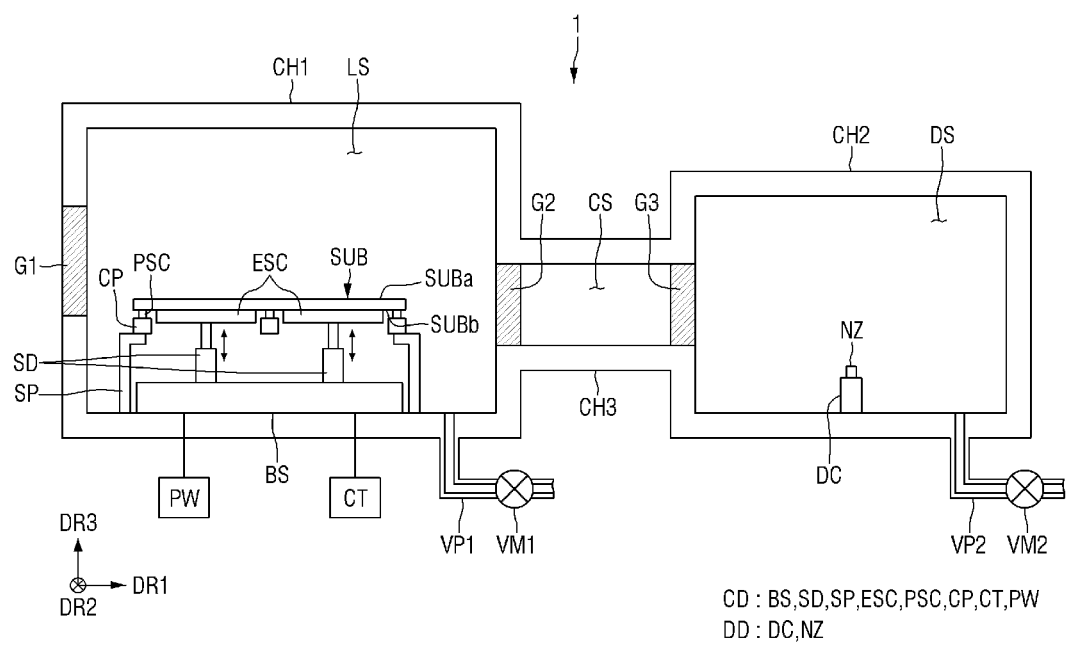
FIG. 1 is a schematic view of an embodiment of an apparatus for manufacturing a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
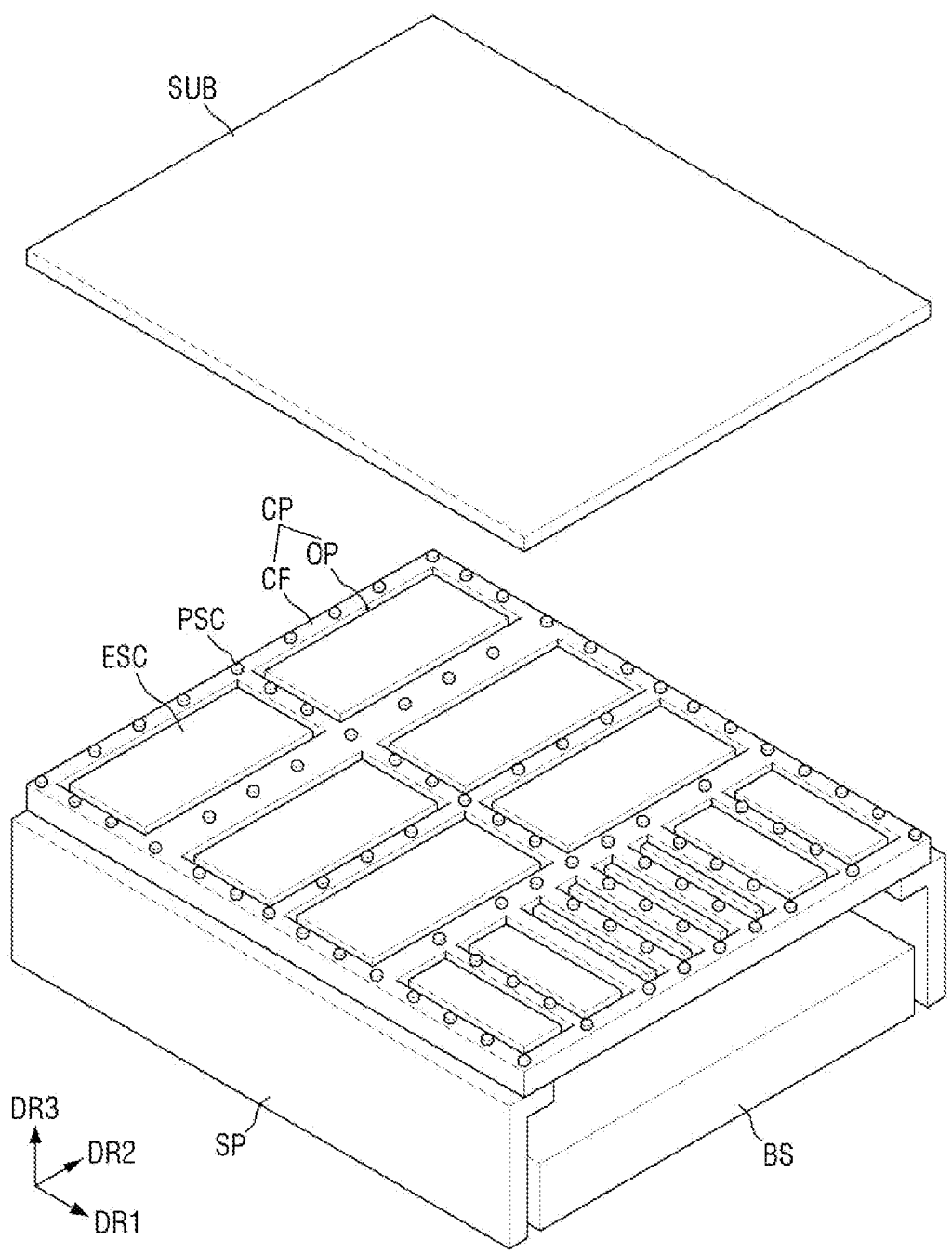
FIG. 2 is a perspective view of a portion of an embodiment of the chucking device of FIG. 1.
Figure 3:
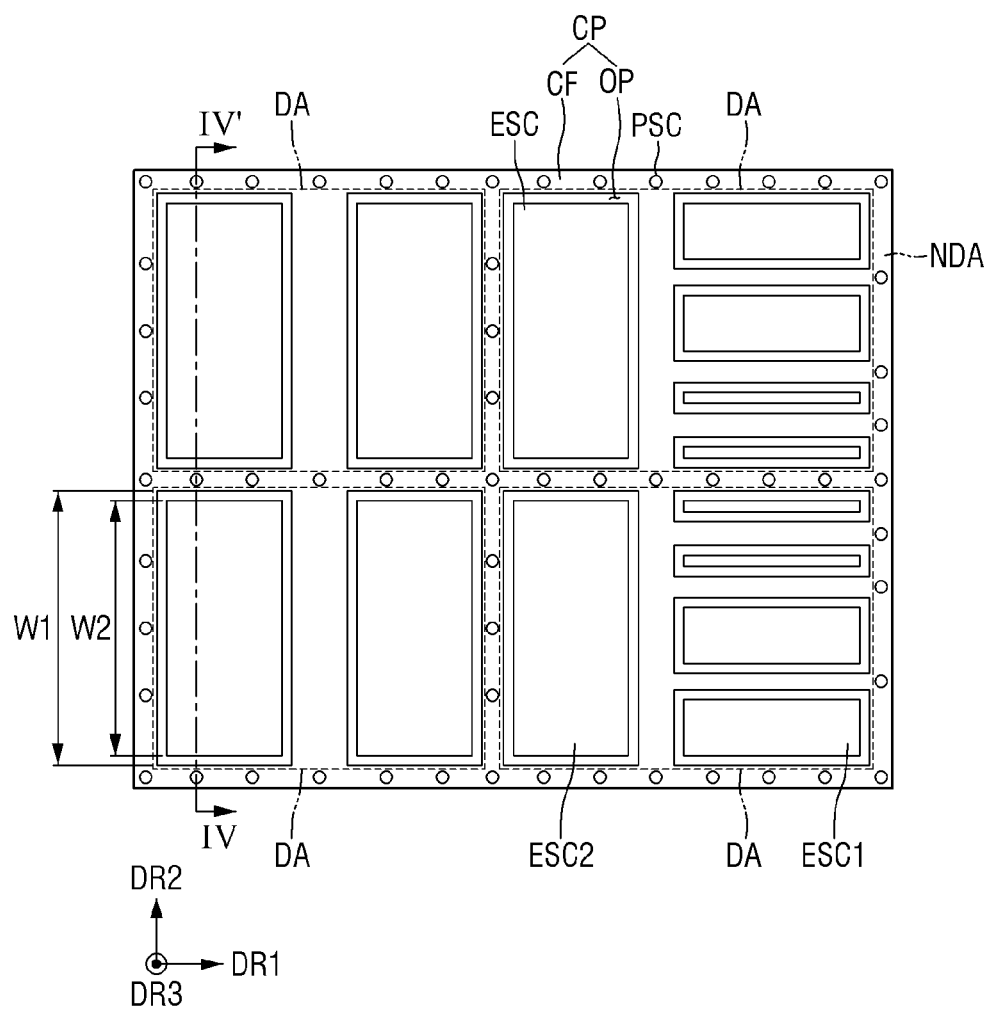
FIG. 3 is a plan view of the chucking device of FIG. 2.
Figure 4:
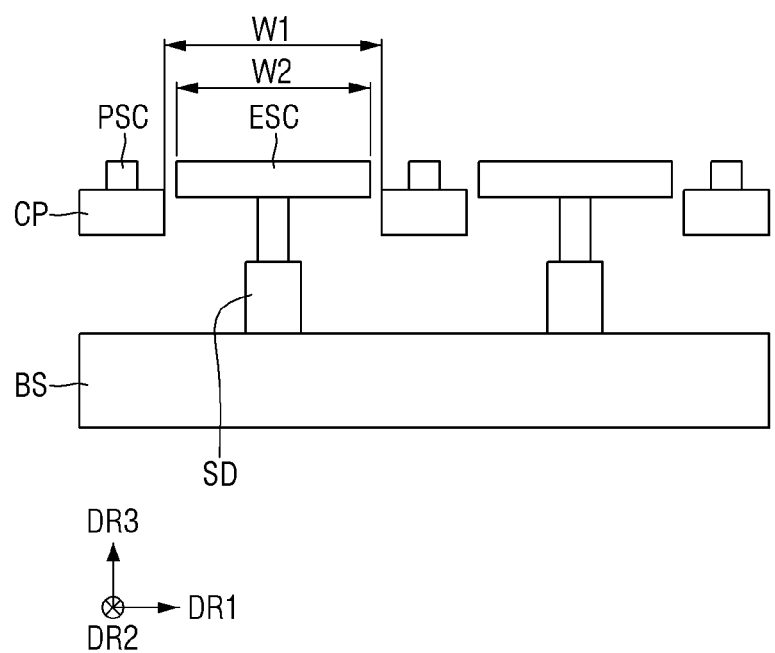
FIG. 4 is a cross-sectional view taken along line IV-IV' of FIG. 3.

FIG. 1 is a schematic view of an embodiment of an apparatus for manufacturing a display device constructed according to the principles of the invention. FIG. 2 is a perspective view of a portion of an embodiment of the chucking device of FIG. 1. FIG. 3 is a plan view of the chucking device of FIG. 2. FIG. 4 is a cross-sectional view taken along line IV-IV' of FIG. 3.

FIGS. 1 to 4, an apparatus 1 for manufacturing a display device may include a movable support in the form of a chucking device CD and a substrate processing device. The chucking device CD may be a device for fixing a target substrate SUB on a support member in the form of a chuck plate CP, and the substrate processing device may be a device for performing manufacturing processes on the target substrate SU,B which is mounted on the chuck plate CP by the chucking device CD. The substrate processing device may be, for example, a deposition device, such as deposition device DD of FIG. 1, an etching device, a cleaning device, a heat treatment device, a laser processing device, a coating device, an inspection device, etc., but embodiments are not limited thereto. In the illustrated embodiments, the deposition device DD for depositing a thin film on the target substrate SUB is illustrated as an example of the substrate processing device.

The deposition device DD may be a device used in a process for manufacturing the display device. For example, the deposition device DD may be used in a process of forming a plurality of thin films included in a liquid crystal display, a field emission display, a plasma display, and an electro-luminescence display.

The target substrate SUB may be an insulating substrate or a substrate including a plurality of thin film structures disposed on the insulating substrate. The target substrate SUB may include an upper surface SUBa on which a thin film is formed in the deposition device DD by material deposited thereon, and a rear surface SUBb which is opposite to the upper surface SUBa.

Examples of methods of forming the thin film on the target substrate SUB include physical vapor deposition (PVD) methods such as a vacuum evaporation method, ion plating method, and a sputtering method, and chemical vapor deposition (CVD) methods by gas reaction. Hereinafter, the vacuum evaporation method will be described, but embodiments of the deposition device DD are not limited thereto.

The deposition device DD may include a deposition source DC in which the material to be deposited is stored, and a nozzle NZ that has a passage through which the material to be deposited is injected. A storage space in which the material to be deposited is stored may be formed inside the deposition source DC. For example, the material to be deposited may be an organic material. Specifically, the material to be deposited may include an organic light emitting material, a hole injection/hole transport material, an electron injection/electron transport material of an organic light emitting display. The material to be deposited, which is an organic material, may be vaporized and then discharged toward the target substrate SUB through the nozzle NZ. An example of a method by which the material to be deposited is vaporized includes heating. For example, a heating coil may be formed on an inner wall of the deposition material, and a current may be applied to the heating coil to generate heat. However, the method of vaporizing the material to be deposited is not limited to heating.

The chucking device CD and the deposition device DD may be located in different chambers. For example, the chucking device CD may be located in a loading chamber CH1, and the deposition device DD may be located in a deposition chamber CH2. The internal space of the loading chamber CH1 may be defined as a loading space LS, and the internal space of the deposition chamber CH2 may be defined as a deposition space DS. Also, the loading space LS and the deposition space DS may be spatially connected to each other by a connection space CS disposed therebetween. The connection space CS is a connection passage through which the chuck plate CP loaded with the target substrate SUB in the loading space LS moves to the deposition space DS The chuck plate CP loaded with the target substrate SUB on which the material is to be deposited in the deposition space DS moves to the loading space LS through the connection passage formed by connection space CS.

The apparatus 1 for manufacturing the display device may include a first gate G1 which is disposed opposite to a first direction DR1 of the loading space LS and configured to enable the target substrate SUB to be drawn in or out from the outside, and a second gate G2 which is disposed toward the first direction DR1 of the loading space LS and connected to the connection space CS. The gates could be reversed such that second gate G2 may be disposed toward the first direction DR1 of the connection space CS.

The apparatus 1 for manufacturing the display device may further include a third gate G3 which is disposed in the first direction DR1 of the loading space LS and connected to the deposition space DS. The third gate G3 may be disposed in the opposition direction of the first direction DR1 of the deposition space DS.

In the deposition process, a vacuum atmosphere may be formed in the loading space LS and the deposition space DS in order to prevent foreign substances or the like from being attached to the target substrate SUB and stably deposit the material to be deposited. To this end, the apparatus 1 for manufacturing the display device may further include vacuum pumps VM1 and VM2 and vacuum tubes VP1 and VP2. The vacuum pumps VM1 and VM2 may include a first vacuum pump VM1 providing the vacuum atmosphere in the loading space LS and a second vacuum pump VM2 providing the vacuum atmosphere in the deposition space DS. The first vacuum pump VM1 may be connected to the loading space LS through the first vacuum tube VP1, and the second vacuum pump VM2 may be connected to the deposition space DS through the second vacuum tube VP2. FIG. 1 illustrates that the vacuum atmosphere is provided in the loading spaces LS and the deposition spaces DS by two different vacuum pumps VM1 and VM2, but the embodiments are not limited thereto, and in the loading space LS and deposition space DS, the vacuum atmosphere may also be provided by one vacuum pump.

The chucking device CD may include the chuck plate CP, a pressure-sensitive chuck PSC, an electrostatic support, which may be in the form of an electrostatic chuck ESC, a base unit BS, a support SP, and an elevating device SD.

The target substrate SUB may be mounted on the chuck plate CP. The chuck plate CP, may include a plurality of openings OP passing through a chuck frame CF, with the chuck frame CF surrounding the plurality of openings OP. The chuck plate CP may have a cuboid appearance, but embodiments are not limited thereto, and may, e.g., have a cylindrical shape and other polyprism shapes.

The opening OP may be a through hole penetrating the chuck frame CF. The shape of each opening OP may be a cuboid, but embodiments are not limited thereto. The size of each opening OP may be substantially the same, but embodiments are not limited thereto. The openings OP may have different sizes from each other. The shape and size of the opening OP may be variously set according to of the particular design of the display device.

The chuck plate CP may include a first area overlapping an area of the target substrate SUB in which the material is to be deposited in the deposition process, and a second area surrounding the first area and overlapping an area of the target substrate SUB in which the material is not to be deposited. The first and second areas may be provided in the form of a deposition area DA and a non-deposition area NDA, respectively. Each opening OP may be included in the deposition area DA. The chuck frame CF positioned between the openings OP may be included in the non-deposition area NDA, but embodiments are not limited thereto, and may be included in the deposition area DA depending on the size, shape, or other specifications of the target substrate SUB to be mounted. For example, a portion of the chuck frame CF positioned between the deposition areas DA adjacent to each other may be included in the non-deposition area NDA. Another portion of the chuck frame CF positioned between the plurality of openings OP corresponding to the area to be used for the same display device in the target substrate SUB may be included in the deposition area DA.

Adhesive patterns, which may be in the form of pressure-sensitive adhesive chucks and/or pressure-sensitive chucks PSC, may be disposed on the chuck frame CF included in the non-deposition area NDA. The target substrate SUB mounted on the chuck plate CP may be formed with a micro pattern by performing various processes such as a deposition process, an exposure process, and an etching process. The pressure-sensitive chuck PSC may fix and/or attach the target substrate SUB to the chuck plate CP so that the position of the target substrate SUB is not changed during the various processes. The pressure-sensitive chuck PSC may include a pressure-sensitive pad, a pressure-sensitive sheet, pressure-sensitive rubber, or the like with adhesion. A rear surface of the pressure-sensitive chuck PSC is fixed and/or attached to the chuck plate CP, and an upper surface of the pressure-sensitive chuck PSC may be fixed and/or attached to the target substrate SUB. Respective pressure-sensitive chucks PSCs are spaced apart from each other, and the upper surfaces of the pressure-sensitive chucks PSCs may be located on substantially the same plane. In addition, the respective pressure-sensitive chucks PSCs may have substantially the same shape and size.

When the deposition area DA includes one opening OP, the plurality of pressure-sensitive chucks PSC may be disposed on the chuck frame CF surrounding the opening OP. When the deposition area DA includes a plurality of openings OPs, the pressure-sensitive chucks PSCs may not be disposed on a portion of the chuck frame CF located between the openings OPs. If the pressure-sensitive chucks PSCs are disposed in the deposition area DA including the plurality of openings OPs, the pressure-sensitive material contained in the pressure-sensitive chuck PSC is melted in a process performed at a high temperature and generates foreign substances such as spots on the target substrate SUB, which causes defects in the display device. The pressure-sensitive chucks PSCs according to the principles and embodiments of the invention may not be disposed in the deposition area DA, but rather may be disposed in the non-decription area NDA surrounding the deposition area DA, thereby avoiding generation of foreign substances on the target substrate.

In a plan view, the electrostatic chuck ESC may be disposed in each opening OP included in the chuck plate CP. The electrostatic chuck ESC may overlap each opening OP, and may be configured to move reciprocally in a third direction DR3 to pass through the opening OP. The electrostatic chuck ESC is connected to a power supply unit PW and may receive power from the power supply unit PW to adsorb and fix the target substrate SUB using electrostatic force. The upper surface of the electrostatic chuck ESC may contact the rear surface SUBb of the target substrate SUB to fix the target substrate SUB. Specifically, when a voltage is applied to the electrostatic chuck ESC, the electrostatic chuck ESC may fix the target substrate SUB since the voltage of the electrostatic chuck ESC causes an opposite potential to be charged to the target substrate SUB and an attraction force is generated by the charged potential of the target substrate SUB and the voltage of the electrostatic chuck ESC.

The electrostatic chuck ESC may have a substantially flat plate shape. The shape and size of each electrostatic chuck ESC may correspond to the shape and size of the opening OP in which the corresponding electrostatic chuck ESC may be disposed. In an embodiment, the shape of the electrostatic chuck ESC is substantially the same as the shape of the opening OP, but the size of the electrostatic chuck ESC is smaller than that of the opening OP. For example, a first width W1, which is the length of a long side of one opening OP, may be greater than a second width W2, which is the length of a long side of the electrostatic chuck ESC.

Also, the plurality of electrostatic chucks ESC may include an electrostatic chuck ESC having a shape extending in a first direction DR1 as shown at ESC1 in FIG. 3 and an electrostatic chuck ESC having a shape extending in a second direction DR2 as shown at ESC2 in FIG. 3.

The elevating device SD may be coupled to the lower portion of the electrostatic chuck ESC and may move the electrostatic chuck ESC reciprocally through the opening OP in the third direction DR3. At this time, the upper surface of each electrostatic chuck ESC may move while maintaining substantially the same plane. In an embodiment, two or more elevating devices SD may be provided, and each may be coupled to each electrostatic chuck ESC. For example, the elevating device SD may include a servo motor or a cylinder, but embodiments are not limited thereto.

The electrostatic chuck ESC overlapping the opening OP in the plan view may move reciprocally back and forth through the opening OP. The upper surface of the electrostatic chuck ESC may move to a position lower than the rear surface of the chuck plate CP. In addition, the lower surface of the electrostatic chuck ESC may move to a position higher than the upper surface of the pressure-sensitive chuck PSC.

The operation of the elevating device SD that moves the electrostatic chuck ESC in the third direction DR3 may be controlled by a control unit CT. The control unit CT may operate the elevating device SD to move the electrostatic chuck ESC through the opening OP such that the target substrate SUB is disposed on and/or pressed against the upper surface of the pressure-sensitive chuck PSC to attach the target substrate SUB to the pressure-sensitive chuck PSC.

The elevating device SD may be coupled to the base unit BS disposed at the bottom. That is, the base unit BS may support the electrostatic chuck ESC and the elevating device SD that moves the electrostatic chuck ESC.

In an embodiment, a support SP may be disposed in the first direction DR1 on opposite sides of the base unit BS. The support SP may support the chuck plate CP during the chucking process. The upper surface of the support SP comes into contact with the chuck plate CP, and may include a substantially flat surface.

The apparatus 1 for manufacturing the display device may chuck (fix) the target substrate SUB on the pressure-sensitive chuck PSC and/or the chuck plate CP using the electrostatic chuck ESC, which contacts the rear surface SUBb of the target substrate SUB rather than the upper surface SUBa of the target substrate SUB, thereby preventing the damage to the target substrate SUB and/or elements of the target substrate SUB disposed on the upper surface SUBa. In addition, foreign substances may be prevented and/or reduced from being attached to the upper surface SUBa of the target substrate SUB.

Figure 5:
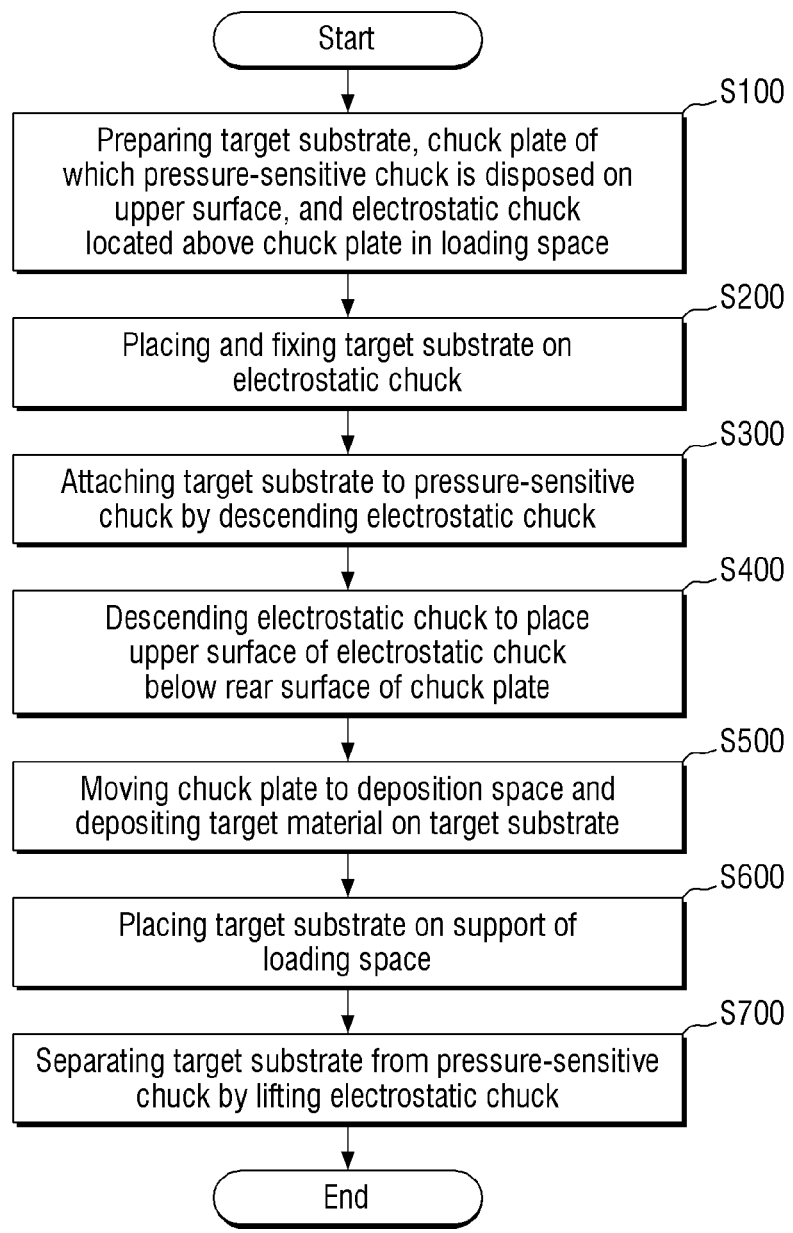
FIG. 5 is a flowchart of an embodiment of a method for manufacturing a display device according to the principles of the invention.

FIG. 5 is a flowchart of an embodiment of a method for manufacturing a display device according to the principles of the invention. FIGS. 6 to 12 are schematic views of an apparatus for manufacturing a display device at some of process steps of the method of FIG. 5.

Hereinafter, an example method for manufacturing a display device using the apparatus 1 of FIG. 1 will be described with reference to FIGS. 5 to 12.

Referring to FIG. 5, the method for manufacturing a display device may include the steps of preparing a target substrate, a chuck plate with a pressure-sensitive chuck disposed on an upper surface, and an electrostatic chuck positioned above the chuck plate in a loading space (S100), placing and fixing a target substrate on the electrostatic chuck (S200), attaching the target substrate to the pressure-sensitive chuck by lowering the electrostatic chuck (S300), continuing to lower the electrostatic chuck to place the upper surface of the electrostatic chuck below the rear surface of the chuck plate (S400), moving the chuck plate to a deposition space and depositing a material on the target substrate in the deposition space (S500), moving the target substrate to a loading space and placing the target substrate on a support in a loading space (S600), and separating the target substrate from the pressure-sensitive chuck by lifting the electrostatic chuck (S700).

First, the step S100 of preparing the target substrate SUB, the chuck plate CP with the pressure-sensitive chuck PSC disposed on its upper surface, and the electrostatic chuck ESC positioned above the chuck plate CP in the loading chamber CH1 may be performed. The loading chamber CHL the target substrate SUB, the pressure-sensitive chuck PSC, the chuck plate CP, and the electrostatic chuck ESC have been described above with reference to FIGS. 1 to 4, and will be omitted below to avoid redundancy.

Figure 6:
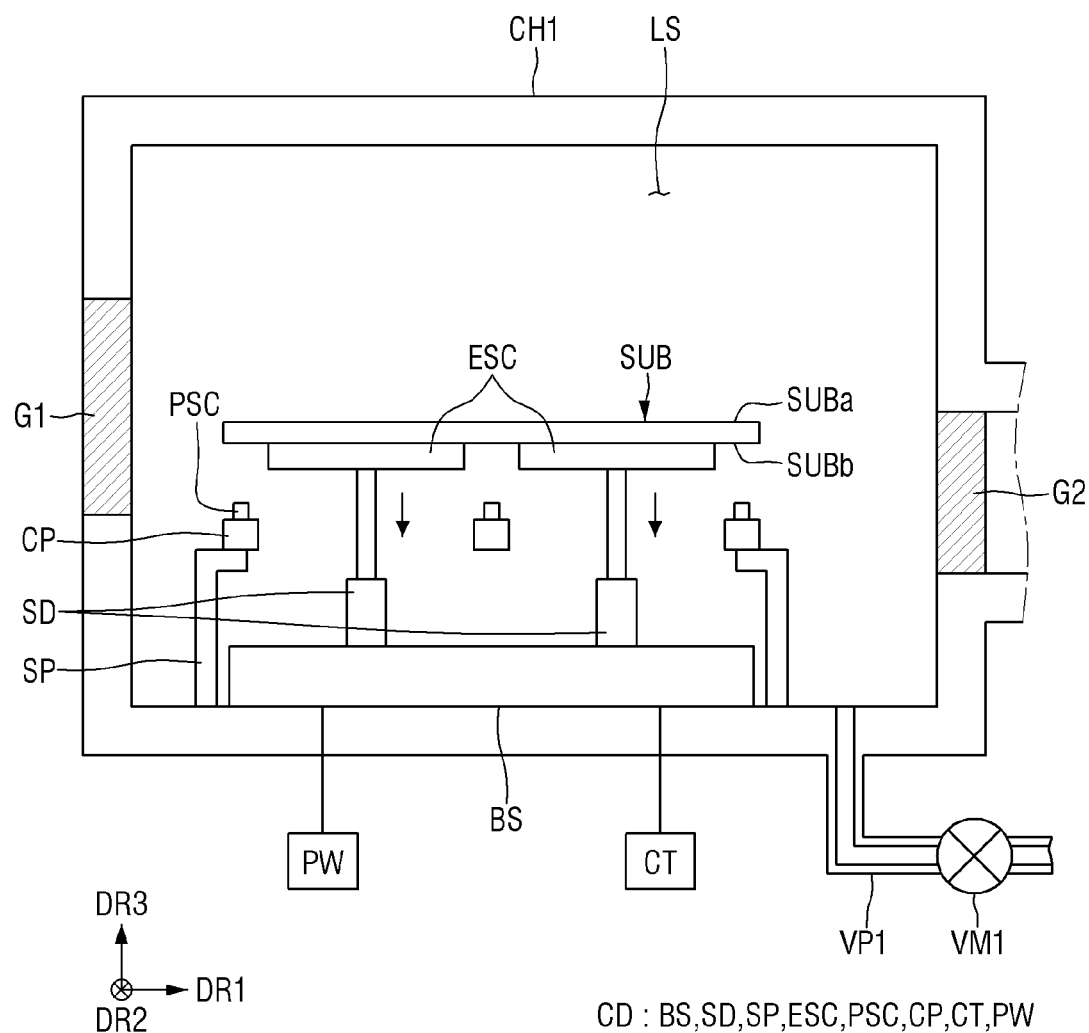
FIGS. 6 to 12 are schematic views of an apparatus for manufacturing a display device at some of process steps of the method of FIG. 5.
Figure 7:
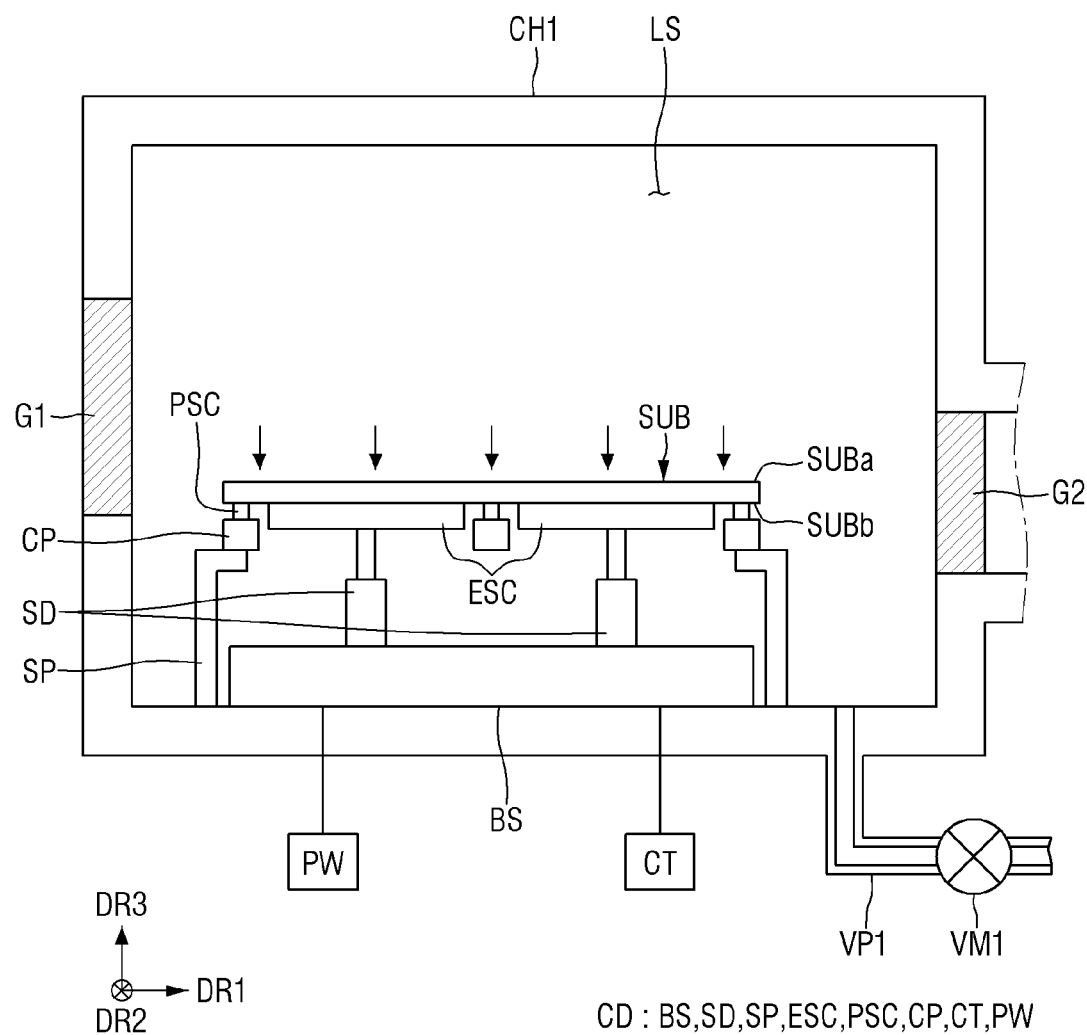

Referring to FIGS. 5, 6 and 7, the step S200 of placing and fixing the target substrate SUB on the electrostatic chuck ESC may be performed. At least a portion of the rear surface SUBb of the target substrate SUB may contact the electrostatic chuck ESC. A voltage may be applied to the electrostatic chuck ESC by a power supply unit PW. As described above, when the voltage is applied to the electrostatic chuck ESC, an electrostatic force is generated and the target substrate SUB may be adsorbed to and/or fixed to the electrostatic chuck ESC by the adsorption force caused by the electrostatic force.

After the target substrate SUB is disposed on the electrostatic chuck ESC, while the first gate G1 and the second gate G2 are closed, a vacuum atmosphere may be formed in the loading space LS through the first vacuum pump VM1. All processes performed below may be performed under vacuum atmosphere.

When the rear surface SUBb of the target substrate SUB is fixed in contact with the electrostatic chuck ESC, the step S300 of chucking and/or attaching the target substrate SUB to the pressure-sensitive chuck PSC by lowering the electrostatic chuck ESC may be performed. The step of lowering the electrostatic chuck ESC may be performed by operating the elevating device SD through the control unit CT. The electrostatic chuck ESC may be lowered until the rear surface SUBb of the target substrate SUB contacts the upper surface of the pressure-sensitive chuck PSC. In this case, the upper surface of the electrostatic chuck ESC and the upper surface of the pressure-sensitive chuck PSC may be positioned on substantially the same plane. Even after the rear surface SUBb of the target substrate SUB comes into contact with the upper surface of the pressure-sensitive chuck PSC, the electrostatic chuck ESC may be forced to descend downwardly, in a direction opposite the third direction DR3, by the elevating device SD. Through this, airtight chucking between the target substrate SUB and the pressure-sensitive chuck PSC may be performed.

Figure 8:
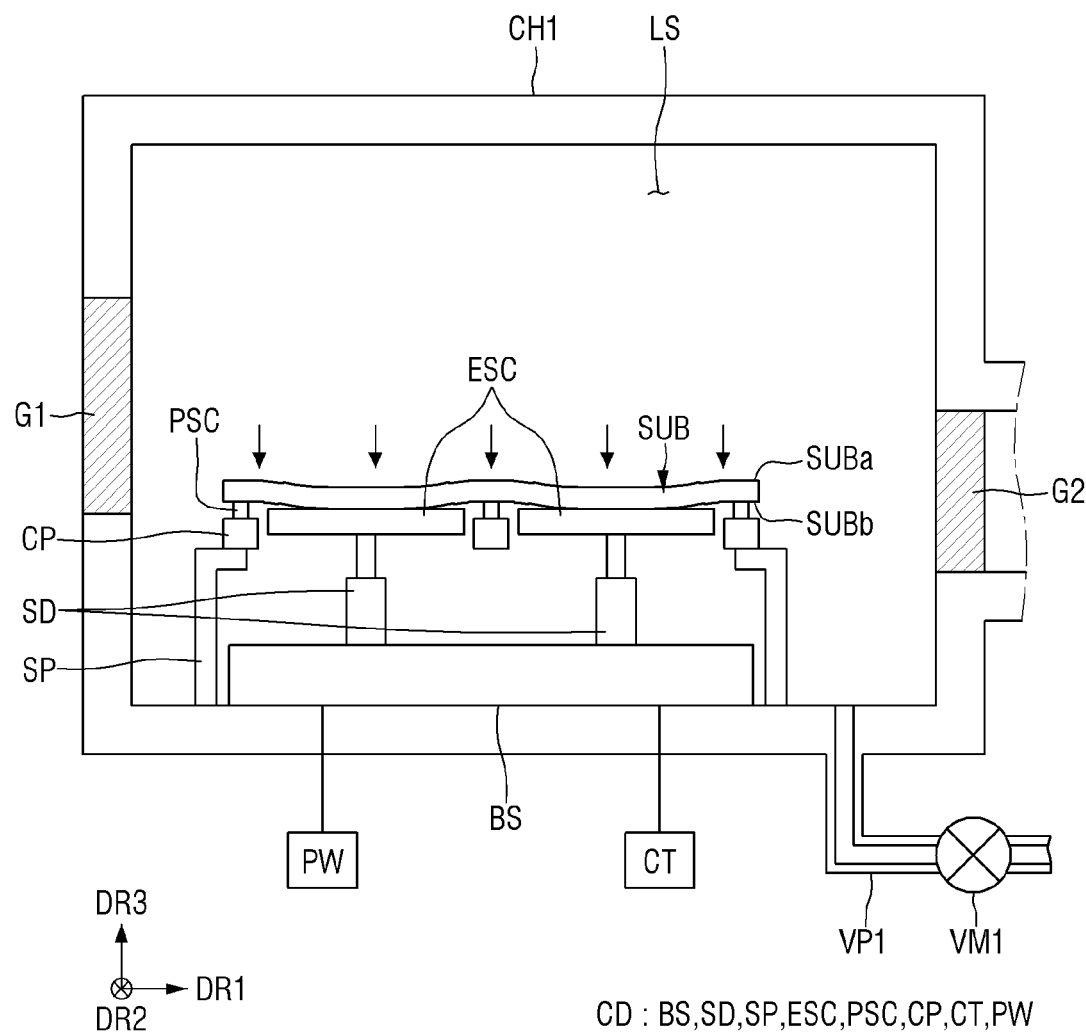
Figure 9:
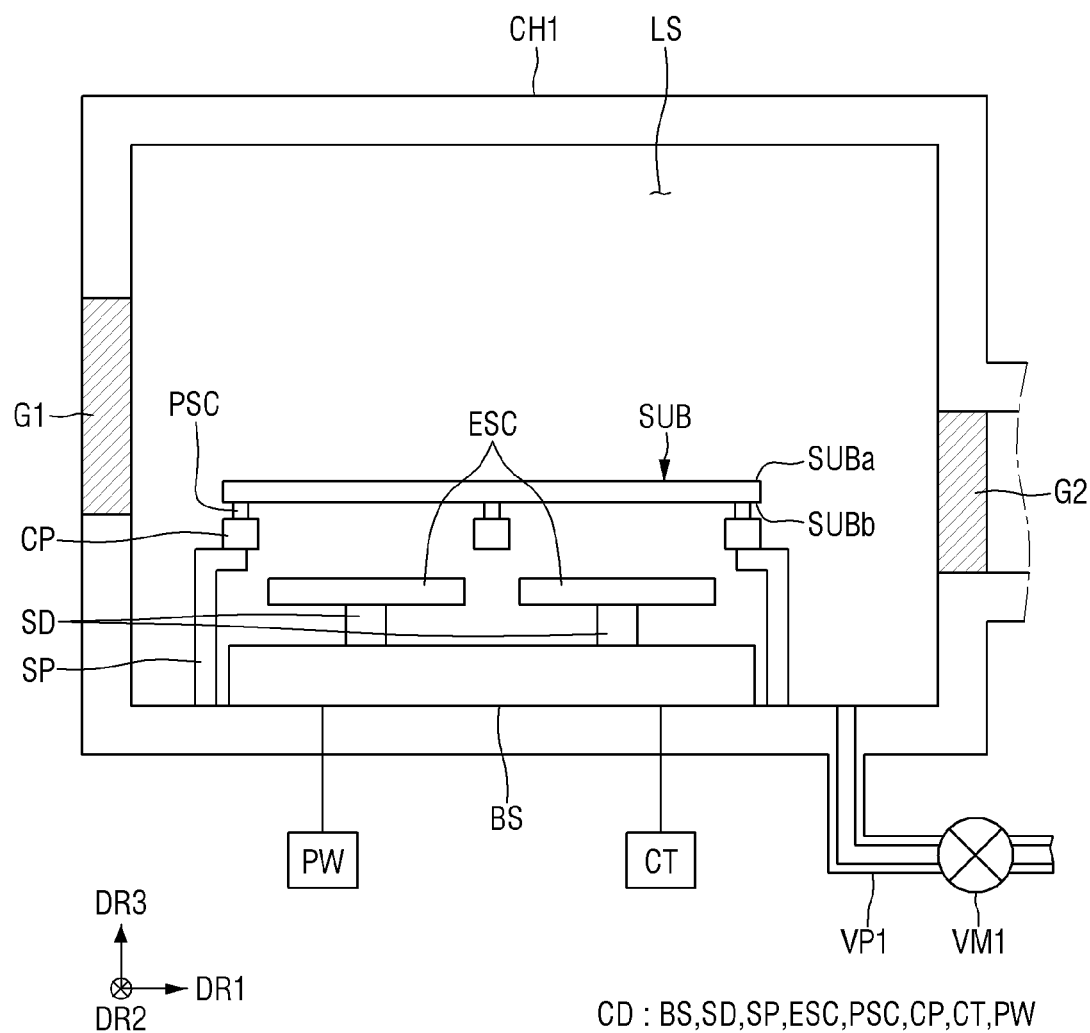

Referring to FIGS. 5, 8 and 9, when the target substrate SUB is chucked and/or attached to the pressure-sensitive chuck PCS, the step S400 of continuing to lower the electrostatic chuck ESC so that the upper surface of the electrostatic chuck ESC is located below the rear surface of the chuck plate CP may be performed. This may also be performed by operating the elevating device SD through the control unit CT. At this time, the power supply unit PW may stop applying the voltage to the electrostatic chuck ESC, but embodiments are not limited thereto, and the power supply unit PW may continue to apply the voltage to the electrostatic chuck ESC for airtight chucking between the target substrate SUB and the pressure-sensitive chuck PCS. Due to the voltage applied to the electrostatic chuck ESC, an electrostatic force may be maintained to keep adhesive force between the target substrate SUB and the electrostatic chuck ESC. The electrostatic chuck ESC having the electrostatic force, which may function as the adhesive force between the target substrate SUB and the electrostatic chuck ESC, may press the target substrate SUB in a direction opposing the third direction DR3 for airtight chucking between the target substrate SUB and the pressure-sensitive chuck PCS.

During lowering of the electrostatic chuck ESC, when the application of the voltage to the electrostatic chuck ESC is not stopped, the elevating device SD may receive a load greater than that of when the application of the voltage to the electrostatic chuck ESC is stopped. In addition, even if the application of the voltage to the electrostatic chuck ESC is stopped, the electrostatic force may remain between the target substrate SUB and the electrostatic chuck ESC, and the remaining electrostatic force may allow the target substrate SUB to be pressed in the direction opposing the third direction DR3 for airtight chucking between the target substrate SUB and the pressure-sensitive chuck PCS when electrostatic chuck ESC descends.

When the upper surface of the electrostatic chuck ESC moves to a position lower than the upper surface of the pressure-sensitive chuck PSC, the target substrate SUB may be bent locally around the opening OP of the chuck plate CP due to adhesion with the electrostatic chuck ESC. Specifically, an area of the target substrate SUB chucked to the electrostatic chuck ESC may move in the direction opposing the third direction DR3 relatively to other areas of the target substrate SUB. Through this, the target substrate SUB may be forced in the direction opposing the third direction DR3 to perform airtight chucking between the pressure-sensitive chuck PSC and the target substrate SUB.

The electrostatic chuck ESC and the target substrate SUB may be maintained to be chucked until the electrostatic chuck ESC descends to a predetermined position, and then a bending portion of the target substrate SUB may be separated and restored to a flat shape again, and the electrostatic chuck ESC may continue to descend to a lower position. In a subsequent process, the chuck plate CP may move to one side in the first direction DR. At this time, in order to facilitate the movement of the chuck plate CP, the electrostatic chuck ESC may descend until the upper surface is located below the rear surface of the chuck plate CP. In addition, the electrostatic chuck ESC may descend until the upper surface is located below the upper surface of the support SP.

Figure 10:
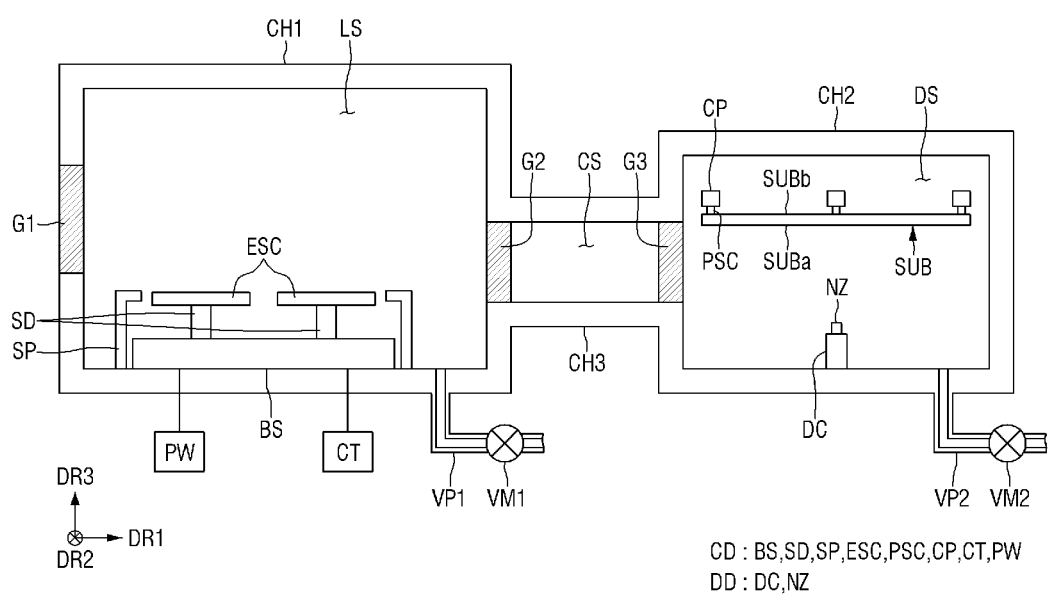

Referring to FIGS. 5 and 10, after the step S400 of continuing to descend the electrostatic chuck ESC so that the electrostatic chuck ESC is located below the rear surface of the chuck plate CP, the step S500 of moving the chuck plate CP to the deposition space DS and depositing the material on the target substrate SUB may be performed. The deposition process may be performed in the deposition space DS inside the deposition chamber CH2. The chuck plate CP may be transferred from the loading space LS to the deposition space DS via the connection space CS by a transfer unit. The chuck plate CP may be rotated 180° so that the upper surface SUBa of the target substrate SUB faces the deposition device DD in the direction opposing the third direction DR3. The step of rotating the chuck plate CP at 180° may be performed in the deposition space DS, but embodiments are not limited thereto, and may also be performed in the loading space LS or the connection space CS.

When the chuck plate CP on which the target substrate SUB is fixed enters the deposition space DS, while the third gate G3 is closed, a vacuum atmosphere may be generated in the deposition space DS by the second vacuum pump VM2.

When the vacuum atmosphere is generated in the deposition space DS, the material may be deposited on the upper surface SUBa of the target substrate SUB by the deposition device DD. In an embodiment, the material to be deposited is stored in the deposition source DC of the deposition device DD and then vaporized to be sprayed through the nozzle NZ toward the upper surface SUBa of the target substrate SUB.

Figure 11:
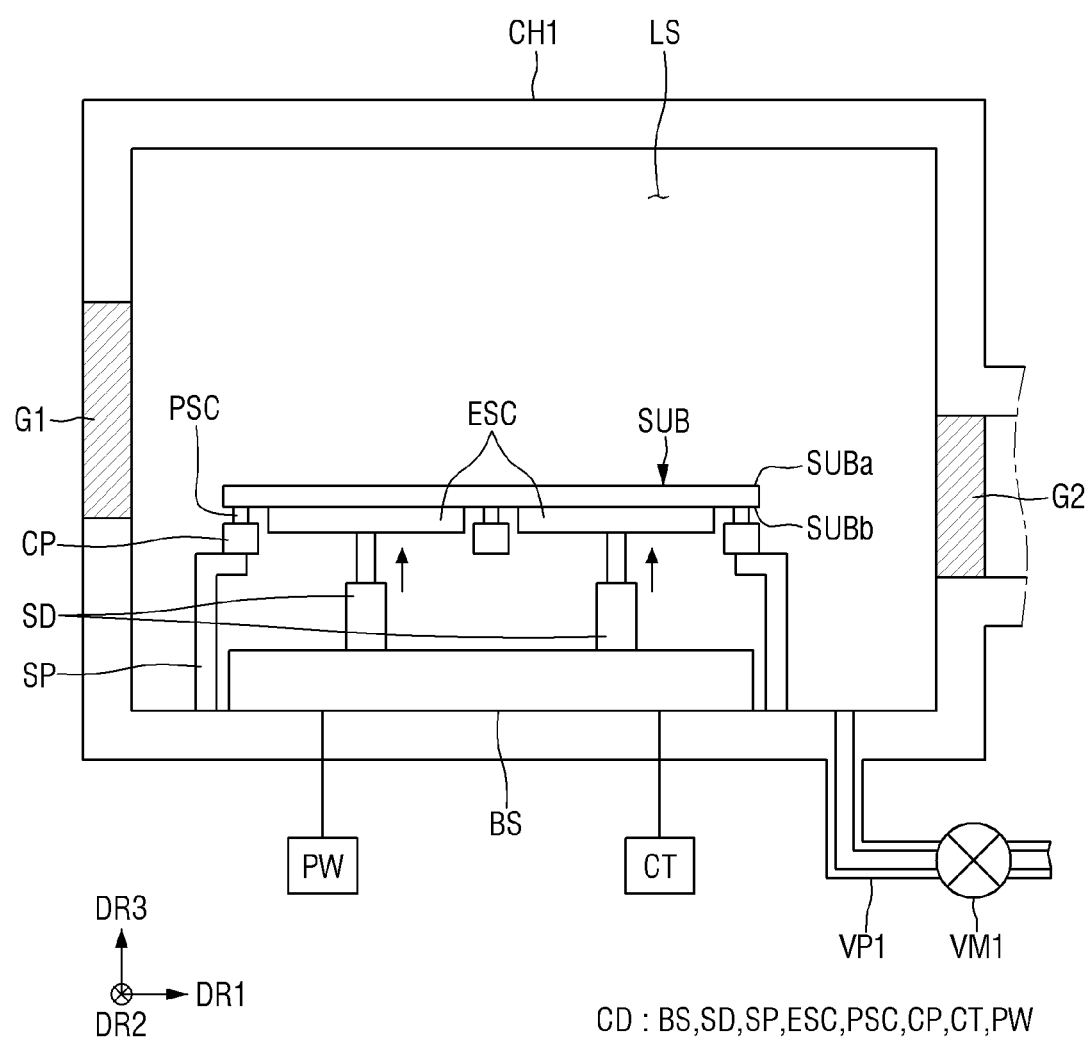

Referring to FIGS. 5 and 11, after the step S500 of depositing the material on the upper surface SUBa of the target substrate SUB, the step S600 of moving the target substrate SUB to the loading space LS and placing the target substrate SUB on the support SP in the loading space LS may be performed. In order to perform another process on the target substrate SUB on which deposition is performed, it is required to separate the target substrate SUB from the chuck plate CP. For this purpose, the chuck plate CP on which the target substrate SUB is fixed may return from the deposition space DS to the loading space LS. The step of separating the target substrate SUB from the chuck plate CP may be performed using the chucking device CD, but embodiments are not limited thereto and the step of separating the target substrate SUB from the chuck plate CP may be performed using other devices.

When the chuck plate CP on which the target substrate SUB is fixed is mounted on the support SP, the electrostatic chuck ESC may ascend toward the chuck plate CP in the third direction DR3. The upper surface of the electrostatic chuck ESC may contact the rear surface SUBb of the target substrate SUB and positioned on substantially the same plane as the upper surface of the electrostatic chuck ESC. The elevating device SD may ascend the electrostatic chuck ESC under the control of the control unit CT. A voltage may be applied to the electrostatic chuck ESC to fix the electrostatic chuck ESC to the target substrate SUB and/or to separate the target substrate SUB from the chuck plate CP. The voltage applied to the electrostatic chuck ESC may be applied before the upper surface of the electrostatic chuck ESC comes into contact with the rear surface SUBb of the target substrate SUB, but embodiments are not limited thereto. In addition, the voltage applied to the electrostatic chuck ESC may also be applied after the upper surface of the electrostatic chuck ESC comes into contact with the rear surface SUBb of the target substrate SUB.

Figure 12:
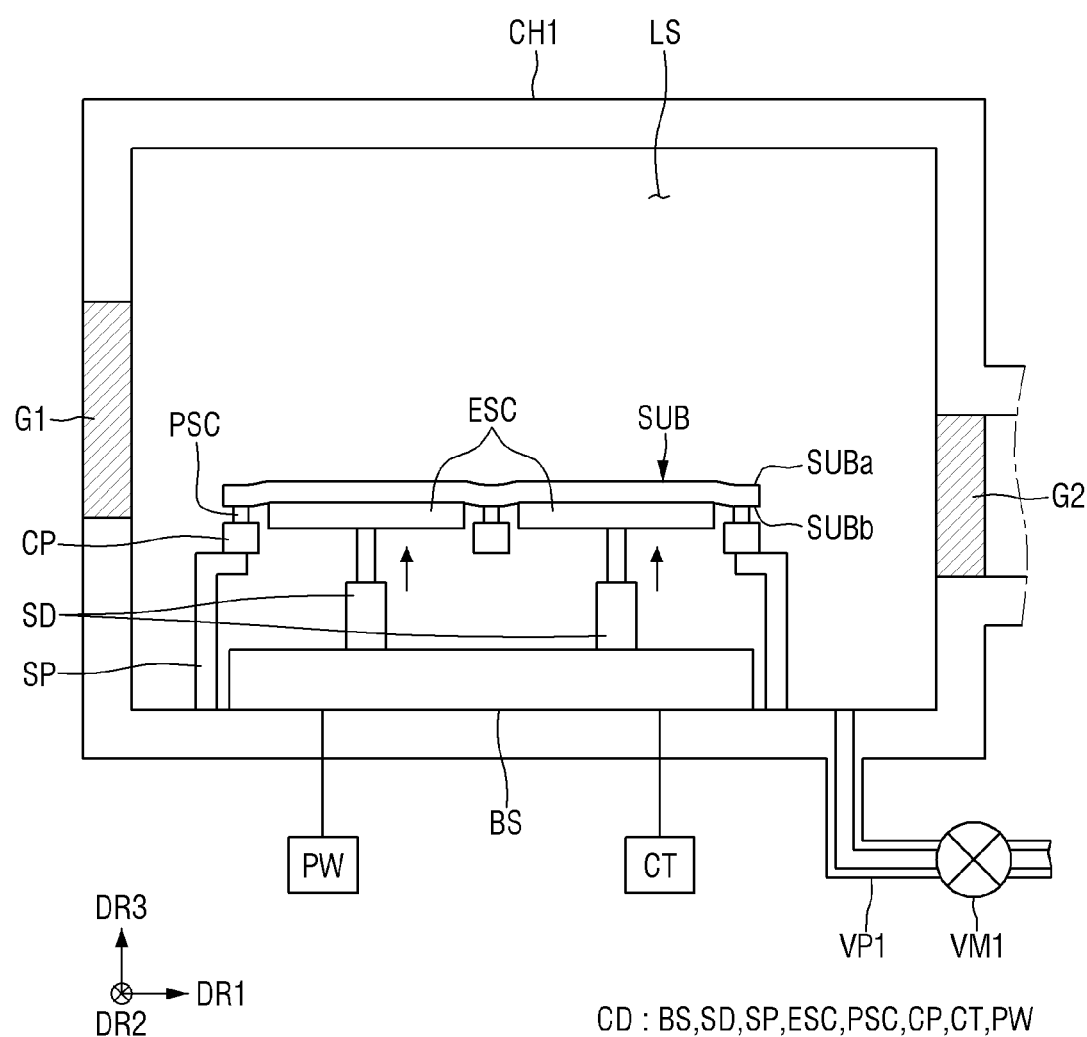

Referring to FIGS. 5 and 12, after the step S600 is performed, the step S700 of separating the target substrate SUB from the pressure-sensitive chuck PSC by lifting the electrostatic chuck ESC may be performed.

When the upper surface of the electrostatic chuck ESC moves to a position higher than the upper surface of the pressure-sensitive chuck PSC, the target substrate SUB may be bent locally around the opening OP of the chuck plate CP due to adhesion between the target substrate SUB and the pressure-sensitive chuck PSC and the pressure from the electrostatic chuck ESC. Specifically, an area of the target substrate SUB chucked to the electrostatic chuck ESC may move in the third direction DR3 relatively to other areas of the target substrate SUB. Through this, the target substrate SUB may be forced in the third direction DR3 to weaken the adhesion between the pressure-sensitive chuck PSC and the target substrate SUB.

The electrostatic chuck ESC and the target substrate SUB may be coupled and fixed together until the electrostatic chuck ESC ascends to a predetermined position. Thereafter, the pressure-sensitive chuck PSC and the target substrate SUB are separated from each other so that the bending portion of the target substrate SUB is restored to a flat shape again and the electrostatic chuck ESC and the target substrate SUB may ascend to a higher position as shown in FIG. 6. At this time, the pressure-sensitive chuck PSC may not be separated from the chuck plate CP. In an embodiment, the adhesion between the pressure-sensitive chuck PSC and the chuck plate CP may be greater than the adhesion between the pressure-sensitive chuck PSC and the target substrate SUB. In addition, even if the upper surface of the electrostatic chuck ESC ascends while coming into contact with the rear surface SUBb of the target substrate SUB, the chuck plate CP may not ascend due to the load of the chuck plate CP itself which is greater than the adhesion between the pressure-sensitive chuck PSC and the target substrate SUB. When the target substrate SUB is separated from the pressure-sensitive chuck PSC, a voltage is continuously applied to the electrostatic chuck ESC, so that the target substrate SUB may be stably separated while being fixed to the electrostatic chuck ESC.

Hereinafter, another embodiment of the apparatus for manufacturing the display device will be described. In the following embodiments, description of substantially the same configuration as that of the embodiment described above will be omitted or simplified to avoid redundancy, and differences will be mainly described.

Figure 13:
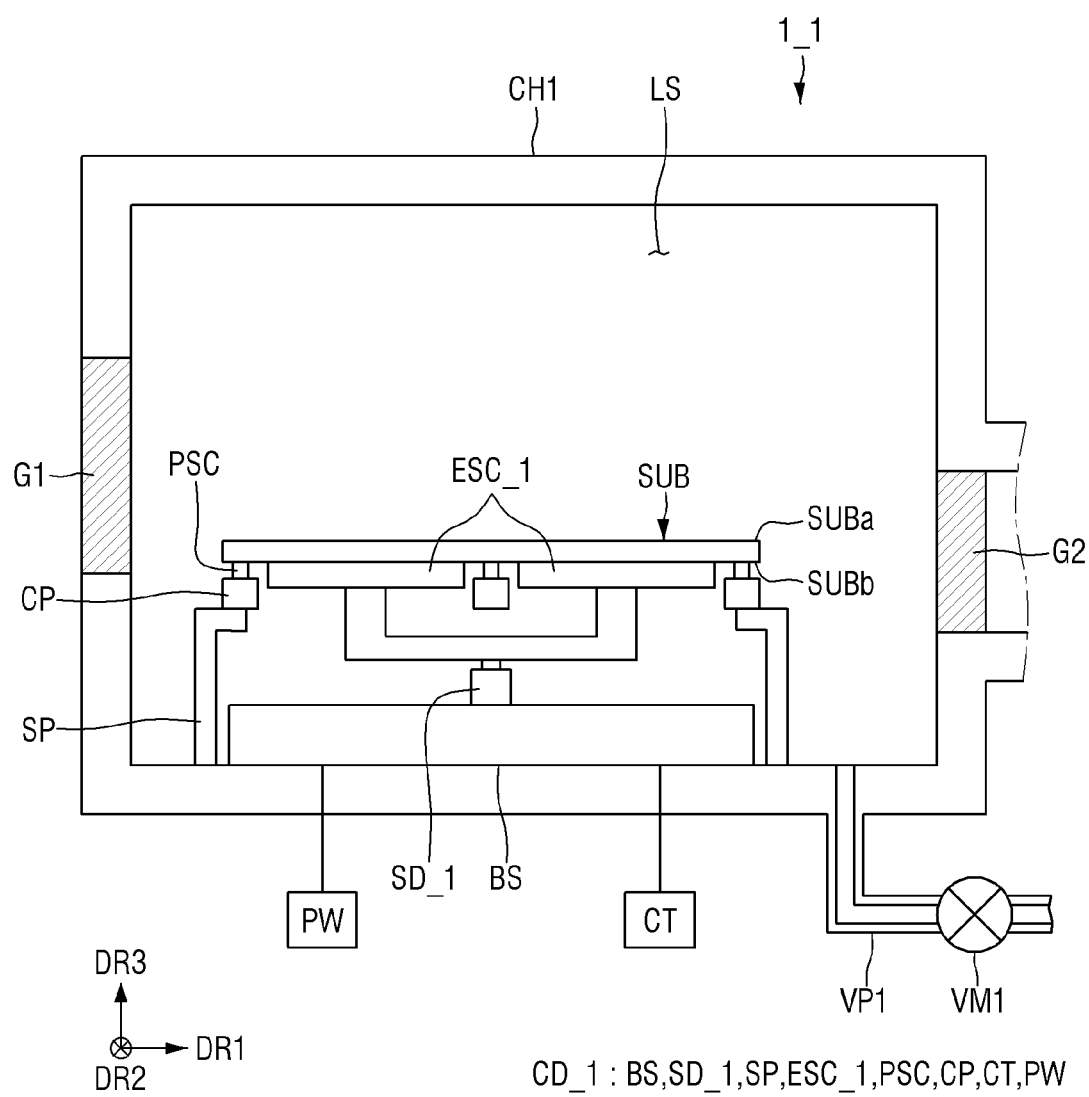
FIG. 13 is a schematic view of another embodiment of an apparatus for manufacturing a display device constructed according to the principles of the invention.

FIG. 13 is a schematic view of another embodiment of an apparatus for manufacturing a display device constructed according to the principles of the invention.

Referring to FIG. 13, an apparatus 1_1 for manufacturing a display device is different from the apparatus 1 of FIG. 1 in that each separated electrostatic chuck ESC_1 may move in a third direction DR3 by one elevating device SD_1. In the apparatus 1_1, the electrostatic chuck ESC_1 may move reciprocally in the corresponding openings OPs in the third direction. The upper surface of the electrostatic chuck ESC_1 may move to a position lower than the rear surface of the chuck plate CP. In addition, the lower surface of the electrostatic chuck ESC_1 may move to a position higher than the upper surface of the pressure-sensitive chuck PSC. The operation of the elevating device SD_1 that moves the electrostatic chuck ESC_1 in the third direction DR3 may be controlled by a control unit CT.

The elevating device SD_1 may be coupled to a base unit BS disposed at the bottom. That is, the base unit BS may support the electrostatic chuck ESC_1 and the elevating device SD_1 that moves the electrostatic chuck ESC_1.

The apparatus 1_1 may chuck (fix) the target substrate SUB on the pressure-sensitive chuck PSC and/or the chuck plate CP using the electrostatic chuck ESC contacting the rear surface SUBb of the target substrate SUB rather than the upper surface SUBa of the target substrate SUB, thereby preventing the damage to the target substrate SUB and/or elements of the target substrate SUB disposed on the upper surface SUBa. In addition, foreign substances may be prevented and/or reduced from being attached to the upper surface SUBa of the target substrate SUB.

Figure 14:
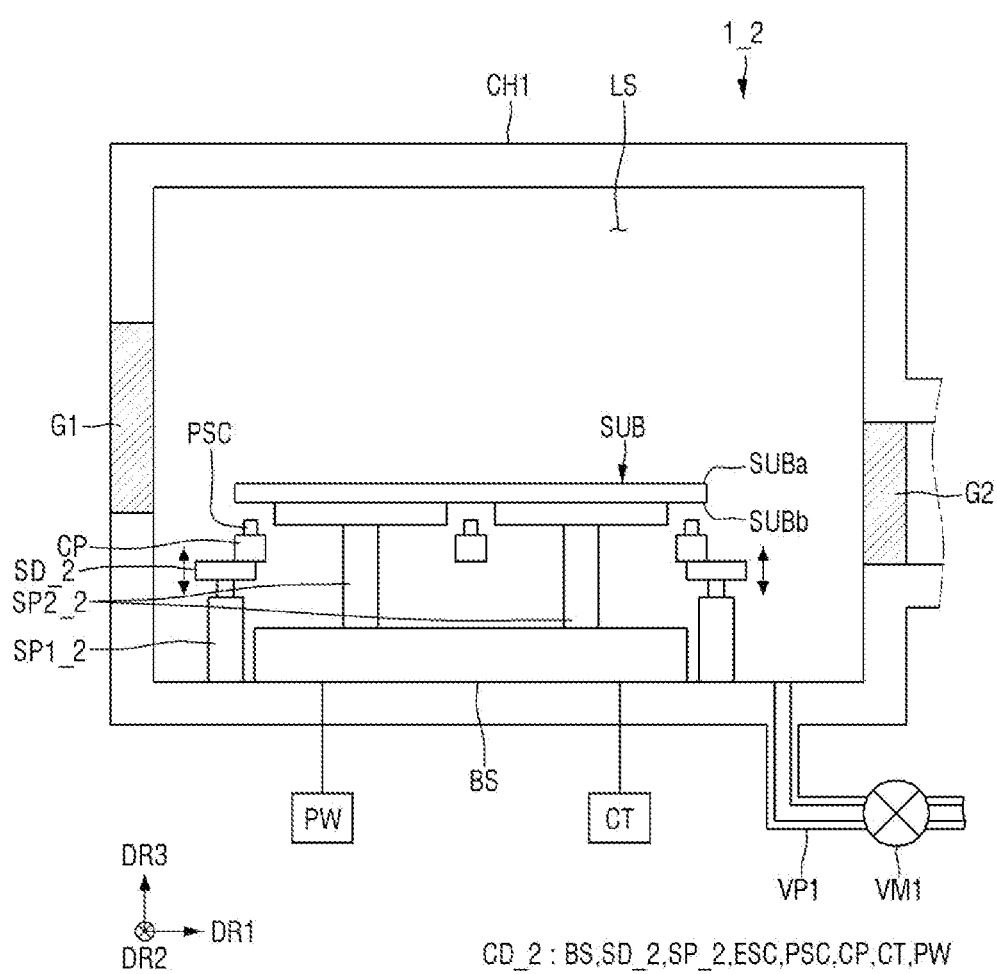
FIG. 14 is a schematic view of still another embodiment of an apparatus for manufacturing a display device constructed according to the principles of the invention.

FIG. 14 is a schematic view of still another embodiment of an apparatus for manufacturing a display device constructed according to the principles of the invention.

Referring to FIG. 14, an apparatus 1_2 for manufacturing a display device is different from the apparatus 1 of FIG. 1 in that an elevating device SD_2 is included in and/or coupled to a first support SP1_2 and to reciprocally move and support a chuck plate CP in a third direction DR3.

An electrostatic chuck ESC may be coupled to the second support SP2_2 disposed at the bottom. The second support SP2_2 may support the electrostatic chuck ESC during a chucking process. The second support SP2_2 may include a wiring for applying a voltage provided from a power supply unit PW to the electrostatic chuck ESC.

The chuck plate CP may be supported by a first support SP1_2 disposed at a lower portion. The chuck plate CP may move in a direction substantially normal to the surface of the electrostatic chuck ESC, which may be the third direction DR3, through the elevating device SD_2 included in the first support SP1_2. As the chuck plate CP moves in the third direction DR3, the electrostatic chuck ESC may move reciprocally in the opening OP of the chuck plate CP. The rear surface of the chuck plate CP may move to a position higher than the upper surface of the electrostatic chuck ESC. In addition, the lower surface of the electrostatic chuck ESC may move to a position higher than the upper surface of the pressure-sensitive chuck PSC. The operation of the elevating device SD_2 that moves the electrostatic chuck ESC in the third direction DR3 may be controlled by a control unit CT.

The apparatus 1_2 for manufacturing the display device may chuck (fix) the target substrate SUB on the pressure-sensitive chuck PSC and/or the chuck plate CP using the electrostatic chuck ESC contacting the rear surface SUBb of the target substrate SUB rather than the upper surface SUBa of the target substrate SUB, thereby preventing the damage to the target substrate SUB and/or elements of the target substrate SUB disposed on the upper surface SUBa. In addition, foreign substances may be prevented and/or reduced from being attached to the upper surface SUBa of the target substrate SUB.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An apparatus for manufacturing a display device, the apparatus comprising:
a first housing having a first chamber;
a support member disposed in the first chamber and including a frame having a plurality of openings;
a plurality of adhesive patterns disposed on the frame; and
a plurality of electrostatic supports overlapping the plurality of openings and supported for reciprocal movement in respective ones of the openings.

2. The apparatus of claim 1, wherein the plurality of adhesive patterns comprises pressure-sensitive chucks spaced apart from each other, and upper surfaces of the pressure-sensitive chucks are located in substantially the same plane.

3. The apparatus of claim 2, wherein the pressure-sensitive chucks have substantially the same shape and size.

4. The apparatus of claim 1, wherein the plurality of electrostatic supports includes a first electrostatic support extending in a first direction and a second electrostatic support extending in a second direction intersecting the first direction.

5. The apparatus of claim 1, further comprising:
one or more elevating devices to move the plurality of electrostatic supports through the openings,
wherein upper surfaces of the plurality of electrostatic supports are configured to move in the openings while maintaining substantially the same plane.

6. The apparatus of claim 5, wherein the electrostatic supports comprise electrostatic chucks and the one or more elevating devices are coupled to the plurality of electrostatic chucks.

7. The apparatus of claim 5, further comprising:
a control unit to operate the one or more elevating devices to move the plurality of electrostatic supports reciprocally through the openings such that a target substrate to be mounted on the plurality of electrostatic supports is pressed against upper surfaces of the adhesive patterns.

8. The apparatus of claim 1, further comprising:
a movable support supporting the support member,
wherein the movable support comprises one or more elevating devices to move the support member in a direction substantially normal to a surface of the plurality of electrostatic supports.

9. The apparatus of claim 1, further comprising:
a second housing having a second chamber connected spatially with the first chamber; and
a substrate processing device disposed in the second chamber.

10. The apparatus of claim 9, wherein the substrate processing device comprises a deposition source having a material to be deposited and a nozzle to inject the material from the deposition source.

11. The apparatus of claim 10, wherein:
the support member comprises a chuck plate, the chuck plate including a first area in which the material is deposited by the substrate processing device and a second area surrounding the first area, and
the plurality of adhesive patterns is disposed in the second area.

* * * * *